United States Patent
Lee et al.

(10) Patent No.: US 7,286,363 B2
(45) Date of Patent: Oct. 23, 2007

(54) HEAT DISSIPATION DEVICE

(75) Inventors: Hsieh-Kun Lee, Tu-Cheng (TW); Wan-Lin Xia, Shenzhen (CN); Bao-Chun Chen, Shenzhen (CN); Neng-Bin Li, Shenzhen (CN)

(73) Assignees: Fu Zhun Precision Industry (Shenzhen) Co., Ltd., Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 182 days.

(21) Appl. No.: 11/168,068

(22) Filed: Jun. 28, 2005

(65) Prior Publication Data

US 2006/0018097 A1   Jan. 26, 2006

(30) Foreign Application Priority Data

Jul. 23, 2004   (CN) ............... 2004 2 0072031 U

(51) Int. Cl.
*H05K 7/20* (2006.01)
*F28F 7/00* (2006.01)

(52) U.S. Cl. ............ 361/709; 361/701; 361/702; 361/703; 361/704; 165/80.2; 165/80.3

(58) Field of Classification Search ............ 361/688, 361/689, 701–704, 709, 711, 728, 747, 707, 361/710, 720, 732, 740; 257/706, 707, 722; 165/80.2, 80.3; 439/485, 487
See application file for complete search history.

(56) References Cited

U.S. PATENT DOCUMENTS 5,841,633 A * 11/1998 Huang .................. 361/695
6,160,709 A * 12/2000 Li ........................ 361/704
6,396,695 B1  5/2002 Lee et al.
6,414,846 B1  7/2002 Chen
6,421,242 B1 * 7/2002 Chen .................... 361/704
6,466,445 B1 10/2002 Chen
6,473,306 B2 * 10/2002 Koseki et al. ............ 361/704
6,501,657 B1 * 12/2002 Carr .................... 361/704

(Continued)

FOREIGN PATENT DOCUMENTS

TW      M247880      10/2004

(Continued)

*Primary Examiner*—Lisa Lea-Edmonds
*Assistant Examiner*—Anthony M Haughton
(74) *Attorney, Agent, or Firm*—Morris Manning Martin LLP; Tim Tingkang Xia, Esq.

(57) ABSTRACT

A heat dissipation assembly includes a heat sink, a retention module and a clip for securing the heat sink to the retention module. The heat sink includes a base for contacting with a heat generating device. The retention module includes a bottom wall and a first sidewall defining a slot therein and extending from the bottom wall. The clip includes a connecting portion pivotably connected to the retention module. The heat sink rests on the bottom wall of the retention module with an end thereof fitting in the slot, and an opposite end thereof being pressed by the clip. The clip can be in a released position that the clip is pivotable, so that the heat sink is removable from the retention module, and a locked position that the clip presses the heat sink. Thus, the heat sink can be secured to the heat generating device expediently.

19 Claims, 3 Drawing Sheets

U.S. PATENT DOCUMENTS

| | | | |
|---|---|---|---|
| 6,785,136 B2 * | 8/2004 | Chang et al. | 361/704 |
| 6,822,869 B2 * | 11/2004 | Huang et al. | 361/704 |
| 7,009,844 B2 * | 3/2006 | Farrow et al. | 361/704 |
| 7,142,430 B2 * | 11/2006 | Lee et al. | 361/719 |

FOREIGN PATENT DOCUMENTS

| | | |
|---|---|---|
| TW | M249436 | 11/2004 |

* cited by examiner

HEAT DISSIPATION DEVICE

BACKGROUND

1. Field

The present invention relates generally to heat dissipation assemblies, and more particularly to a heat dissipation assembly used for electronic devices.

2. Prior Art

With advancement of computer technology, electronic devices operate rapidly. It is well known that the more rapidly the electronic devices operate, the more heat they generate. If the heat is not dissipated duly, the stability of the operation of the electronic devices will be impacted severely. Generally, in order to ensure the electronic device to run normally, a heat dissipation assembly comprising a heat sink is used to dissipate the heat generated by the electronic device. And in order to keep the heat sink intimately contacting the electronic device, a locking device is usually desired for the heat dissipation assembly to secure the heat sink to the electronic device.

Nowadays, numerous heat dissipation assemblies-are used to dissipate heat generated by the electronic devices. Typically, a heat dissipation assembly comprising a strip-shaped clip is used widely. The clip is made by stamping a metal sheet and two ends thereof form two locking portions respectively. The heat dissipation assembly further comprises a retention module around the electronic device. The retention module comprises retaining members for engaging with the locking portions of the clip. In use, the clip spans in a groove defined in a heat sink resting on the electronic device. The locking portions of the clip are engaged with the retaining members of the retention module. Here, the clip is deformed and presses the heat sink to contact with the electronic device. However, during the attachment of the heat sink to the electronic device, it is considerably laborious to overcome the rigidity of the clip to engage the locking portion with the retaining member of the retention module. It is inconvenient during the assembling operation.

SUMMARY

Accordingly, what is needed is a heat dissipation assembly of which a heat sink can be secured to a retention module and a heat generating electronic device expediently.

A heat dissipation assembly of a preferred embodiment of the invention comprises a heat sink, a retention module and a clip for securing the heat sink to the retention module. The heat sink comprises a base having a bottom surface for contacting with a heat generating electronic device. The retention module comprises a bottom wall and a first sidewall defining a slot therein and extending from the bottom wall. The clip comprises a connecting portion pivotably connected to the retention module. The heat sink rests on the bottom wall of the retention module with a bulge formed on a side of the base fitting in the slot, and a border portion formed on an opposite side of the base being pressed by the clip. The clip can be at a released position that the clip is pivotable, so that the heat sink is removable from the retention module, and a locked position that the clip presses the heat sink toward the retention module. Thus, the heat sink can be secured to the retention module and the heat generating device expediently.

Other advantages and novel features of the invention will become more apparent from the following detailed description when taken in conjunction with the accompanying drawings, in which:

DETAILED DESCRIPTION OF THE EMBODIMENT

Figure 1:
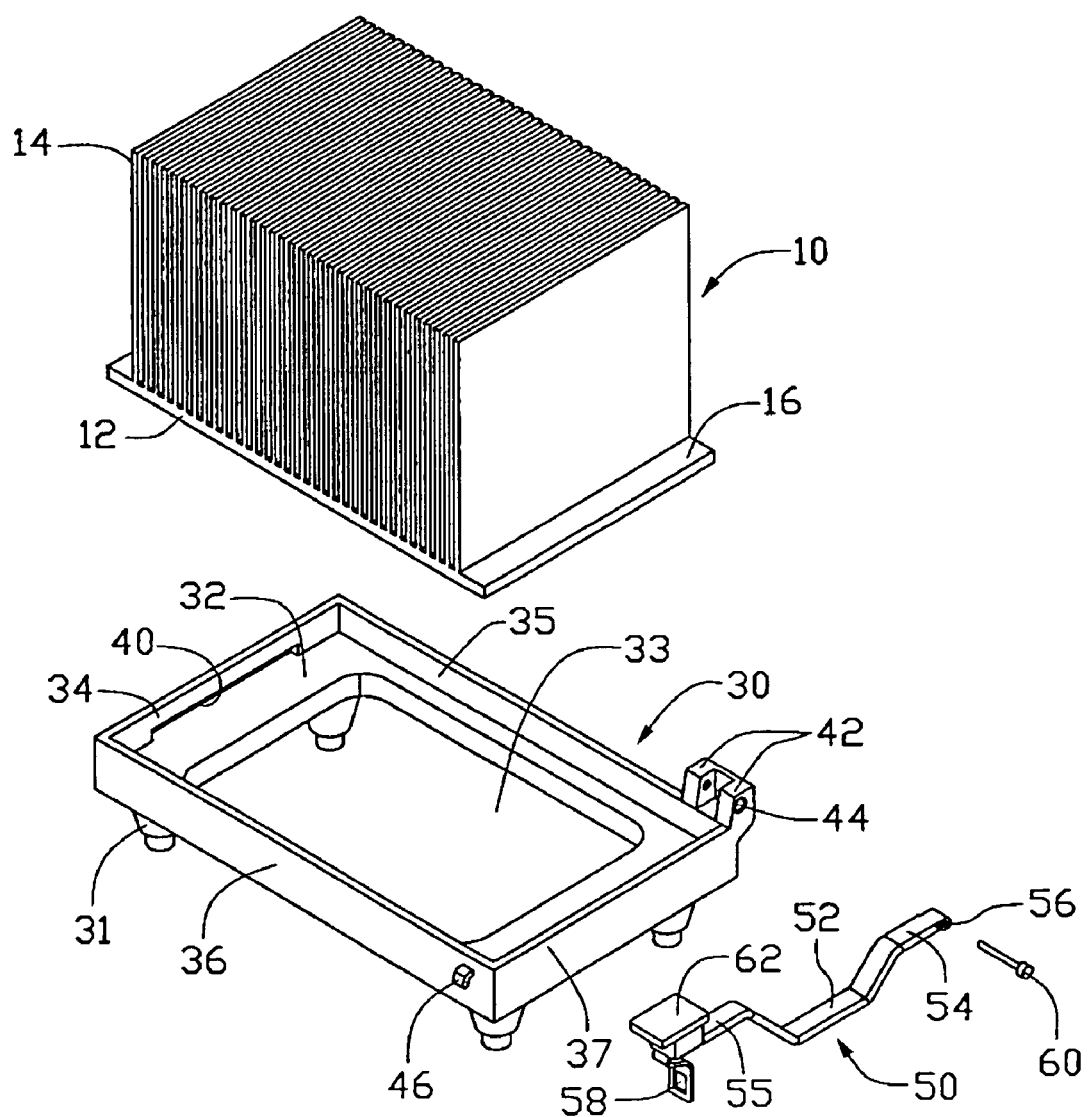
FIG. 1 is an exploded view of a heat dissipation assembly according to a preferred embodiment of the present invention.
Figure 2:
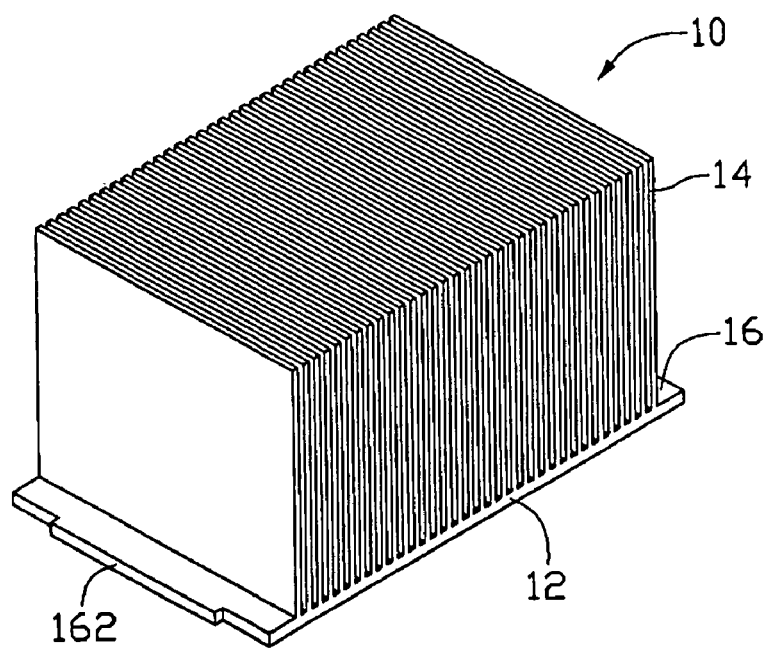
FIG. 2 shows a heat sink of FIG. 1.

Referring to FIGS. 1-2, a heat dissipation assembly comprises a heat sink 10, a retention module 30 and a clip 50 for securing the heat sink 10 to a heat generating electronic device (not shown) located on a printed circuit board (not shown) and surrounded by the retention module 30.

The heat sink 10 comprises a base 12 having a bottom surface (not labeled) for contacting the electronic device, and a plurality of fins 14 extending upwardly from the base 12. The base 12 has two border portions 16 at two opposite sides thereof respectively. There is no fin on the border portions 16. One of the border portions 16 further has a bulge 162 extending outwardly from an outer side thereof.

The retention module 30 is a substantially rectangular frame, and is located around the electronic device, and comprises a bottom wall 32 defining an opening 33 in a center thereof for receiving the electronic device. Four feet 31 depend from four corners of the bottom wall 32 respectively, for fixing the retention module 30 to the printed circuit board. The retention module 30 has a first sidewall 34, a second sidewall 35, a third sidewall 36 and a forth sidewall 37 extending upwardly from the bottom wall 32 to form a circumference thereof. The second sidewall 35 and the third sidewall 36 respectively extend from two ends of the first sidewall 34. The first sidewall 34 defines a slot 40 therein at a location immediately adjacent to the bottom wall 32, for fittingly receiving the bulge 162 of the base 12 therein. The second sidewall 35 forms two opposite erecting pivot portions 42 at an end thereof remote from the slot 40, for pivotally connecting with the clip 50. Each pivot portion 42 defines a pivot hole 44 therein for receiving a pivot 60 to connect the clip 50 to the retention module 30. The third sidewall 36 extends an ear 46 from an outer surface thereof in a direction away from the pivot portions 42, for engaging with the clip 50.

The clip 50 is formed by stamping a metal strap, and comprises a pressing portions 52 for pressing the base 12 of the heat sink 10. The pressing portion 52 is substantially U-shaped, which provides flexibility for the clip 50. A connecting portion 54 and an engaging portion 55 extend outwards from two ends of the pressing portion 54 respectively. A distal end of the connecting portion 54 is curled to form a through hole 56 aligned with the pivot holes 44, for insertion of the pivot 60. The engaging portion 55 has a clamping portion with a clamping hole 58 defined therein depending from a distal end thereof. An operating member 62 is attached to the engaging portion 55 on the distal end thereof above the clamping portion, for facilitating the operation of the clip 50.

Figure 3:
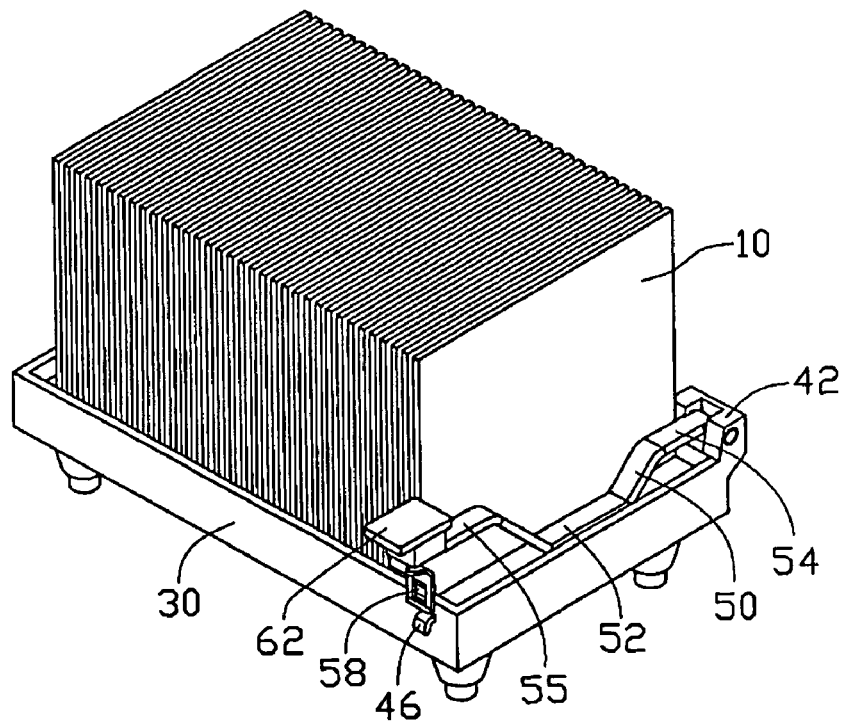
FIG. 3 is an assembled view of FIG. 1 with a end of a clip not fastened to a retention module.
Figure 4:
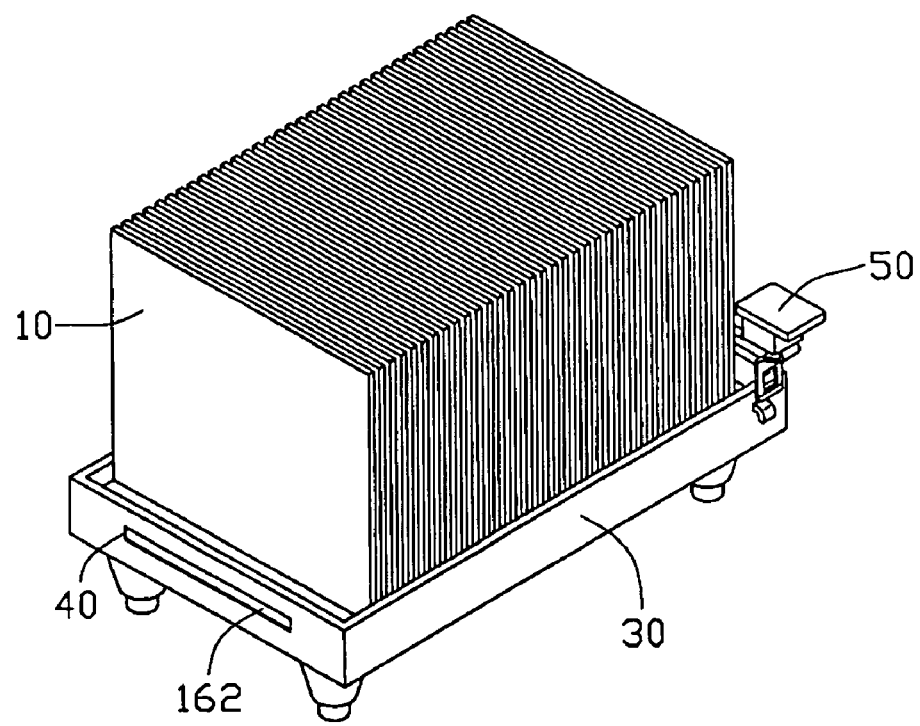
FIG. 4 is a view similar to FIG. 3 but from a different aspect.
Figure 5:
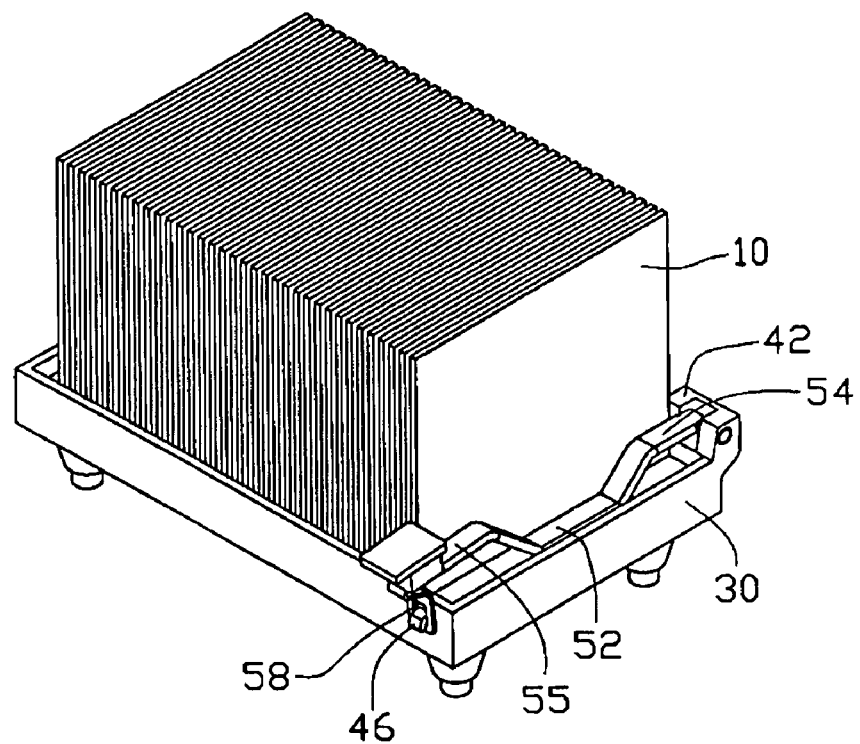
FIG. 5 is a view similar to FIG. 3, with the end of the clip engaged with the retention module.

Referring to FIGS. 3-5, in assembly, the heat sink 10 rests on the bottom wall 32 of the retention module 30, with the bottom surface of the base 12 contacting the electronic device and the bulge 162 of one border portion 16 of the base 12 received in the slot 40 of the retention module 30 (particularly see FIG. 4). The clip 50 is pivotably connected between the two pivot portion 42 of the retention module 30 via the pivot 60 being received in the pivot holes 44 and the through hole 56 (particularly see FIG. 3). Pressing the operating member 62, the clamping portion of the clip 50 is engaged with the ear 46 of the retention module 30 via the ear 46 being received in the clamping hole 58 (particularly FIG. 5). Here, the clip 50 deforms flexibly and a bottom of the pressing portion 52 presses another border portion 16 of the heat sink 10 downwardly. Thus, the heat sink 10 is intimately secured to the heat generating electronic device.

According to the above embodiment of the invention, the retention module 30 defines a slot 40 which can receive the bulge 162 at a side of the heat sink 10 therein. The clip 50 has the connecting portion 54 pivotally connected to the retention module 30, such that when the clip 50 is at a released position, the clip 50 is pivotable around the pivot portions 42, whereby the heat sink 10 is removable from the retention module 30, and when at a locked position, the engaging portion 55 of the clip 50 is also engaged with the retention module 30, whereby the another border portion 16 of the heat sink 10 is pressed by the pressing portion 52 of the clip 50. So, it is expedient to secure the heat sink 10 to the heat generating electronic device.

For removal of the heat sink 10 from the electronic device, the operating member 62 is pressed to disengage the clamping portion of the clip 50 from the ear 46 of the retention module 30, and then the clip 50 is pivoted upwardly so that the pressing portion 52 separates from the other border portion 16. Here, the press of the clip 50 to the base 12 of the heat sink 10 is released, and the heat sink 10 can be removed from the retention module 30 with the bulge 162 out of the slot 40. Thus, the disassembly of the heat sink 10 from the electronic device is also expediently.

Additionally, according to the preferred embodiment of the invention, the retention module 30 has the slot 40 receiving the bulge 162 of the heat sink 10 therein, so that only one clip is desired to secure the heat sink 10 to the retention module 30 and the electronic device. Thus, the cost of the heat dissipation assembly is lowered.

It is to be understood, however, that even though numerous characteristics and advantages of the present invention have been set forth in the foregoing description, together with details of the structure and function of the embodiment, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. A heat dissipation assembly comprising:
a heat sink, comprising a base adapted for contacting a heat generating device;
a retention module adapted for being located around the heat generating device, the retention module comprising a bottom wall and a first sidewall defining a slot therein extending from the bottom wall; and
a clip having a connecting portion at one end thereof pivotably connected to the retention module;
wherein, the slot extends through the first sidewall from an inner face to an outer face of the first sidewall of the retention module, the heat sink rests on the bottom wall of the retention module with an end thereof received in the slot, and an opposite end thereof being pressed by the clip, and the clip can be at a released position that the clip is pivotable, so that the heat sink is removable from the retention module, and a locked position that the clip presses the heat sink.

2. The heat dissipation assembly of claim 1, wherein the base comprises a bulge at the end and a border portion at the opposite end, and the bulge is received in the slot of the retention module, and the clip abuts against the border portion, the bulge having a length less than that of the border portion.

3. The heat dissipation assembly of claim 1, wherein the connecting portion of the clip defines a through hole, and the retention module has two opposite erecting pivot portions with two pivot holes defined therein extending from a second sidewall adjacent the first sidewall, and the clip is pivotably connected between the two pivot portions via a pivot received in the through hole and two pivot holes.

4. The heat dissipation assembly of claim 3, wherein the clip at an opposite end thereof comprises an engaging portion with a clamping hole defined therein, and the retention module forms an ear at a sidewall opposite to the second sidewall, and the ear is received in the clamping hole.

5. The heat dissipation assembly of claim 4, wherein the clip comprises a pressing portion connecting the connecting portion and the engaging portion.

6. The heat dissipation assembly of claim 5, wherein the pressing portion is U-shaped and presses the heat sink.

7. The heat dissipation assembly of claim 1, wherein the bottom wall defines an opening at a center thereof.

8. The heat dissipation assembly of claim 1, wherein the clip has an operating member attached on an opposite end thereof.

9. A heat dissipation assembly comprising:
a retention module adapted for being located around a heat generating device, the retention module comprising a bottom wall and a sidewall extending from the bottom wall, a slot being defined in the sidewall and adjoined to the bottom wall, the slot extending through the sidewall from an inner face to an outer face of the sidewall;
an elongated clip, the clip being juxtaposed to but separate from the sidewall of the retention module;
a heat sink having an end thereof received in the slot and an opposite end thereof sandwiched between the bottom wall and the clip.

10. The heat dissipation assembly of claim 9, wherein the clip comprises an end thereof pivotably connected to a side of the retention module and an opposite end thereof detachably engaged with an opposite side of the retention module.

11. The heat dissipation assembly of claim 10, wherein the retention module at the side thereof forms at least one opposite erecting pivot portion with at least one pivot hole defined therein, and the clip at the end thereof defines a through hole, and the clip is pivotably connected to the at least one pivot portion via a pivot received in the at least one pivot hole and the through hole.

12. The heat dissipation assembly of claim 11, wherein the retention module at the opposite side thereof forms an ear opposite to the at least one pivot portion, and the clip at the opposite end thereof defines a clamping hole receiving the ear therein.

13. The heat dissipation assembly of claim 10, wherein the clip comprises a connecting portion at the end thereof pivotably connected to the side of the retention module, an engaging portion at the opposite end thereof detachably engaged with the opposite side of the retention module, and a pressing portion connecting the connecting portion and the engaging portion.

14. The heat dissipation assembly of claim 13, wherein the pressing portion is U-shaped, and the pressing portion presses the heat sink.

15. The heat dissipation assembly of claim 10, wherein the clip further comprises an operating member attached to the opposite end thereof.

16. The heat dissipation assembly of claim 9, wherein the heat sink forms two border portions at the end and the opposite end of the heat sink, one of the two border portions further extending a bulge received in the slot of the sidewall of the retention module, and the other of the two border portions being pressed by the clip, the bulge having a length less than that of the border portions.

17. The heat dissipation assembly of claim 9, wherein the bottom wall defines an opening at a center thereof.

18. A heat dissipation assembly adapted for dissipating heat generated by an electronic device mounted on a printed circuit board, comprising:
- a rectangular retention module adapted for mounting on the printed circuit board and surrounding the electronic device;
- a heat sink adapted for contacting with the electronic device, being mounted on the retention module and having a portion fitting into a slot extending through a sidewall from an inner face to an outer face of the sidewall of the retention module; and
- a clip having a first end pivotally connected to an end of an opposite sidewall of the retention module, a second end engaging with an opposite end of the opposite sidewall of the retention module and a pressing portion between the first and second ends and exerting a pressing force on the heat sink toward the retention module.

19. The heat dissipation assembly of claim 18, wherein the heat sink has a base having a bottom surface adapted for contacting with the electronic module, a plurality of fins extending upwardly from the base, and first and second border portions located on two opposite sides of the base and having no fin thereon, the first border portion having a bulge on an outer side thereof which fits into the slot of the sidewall of the retention module, and the pressing portion of the clip exerting the pressing force on the second border portion, the bulge having a length less than that of each of the first and second border portions.

* * * * *